United States Patent
Wang et al.

(10) Patent No.: US 7,466,587 B2
(45) Date of Patent: Dec. 16, 2008

(54) NON-VOLATILE MEMORY DEVICE AND METHOD OF PROGRAMMING A MULTI LEVEL CELL IN THE SAME

(75) Inventors: Jong Hyun Wang, Cheongju-si (KR); Se Chun Park, Seoul (KR); Seong Hun Park, Gunsan-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/765,518

(22) Filed: Jun. 20, 2007

(65) Prior Publication Data

US 2008/0158953 A1    Jul. 3, 2008

(30) Foreign Application Priority Data

Dec. 28, 2006    (KR) ..................... 10-2006-0136356

(51) Int. Cl.
*G11C 11/34* (2006.01)
(52) U.S. Cl. .............. 365/185.03; 365/185.21; 365/185.25
(58) Field of Classification Search ............ 365/185.03, 365/185.21, 185.25
See application file for complete search history.

(56) References Cited

U.S. PATENT DOCUMENTS 7,336,532 B2 *  2/2008  Chen .................... 365/185.03
7,366,014 B2 *  4/2008  Micheloni et al. ...... 365/185.03

FOREIGN PATENT DOCUMENTS

| KR | 1020060052142 A | 5/2006 |
| KR | 1020060056236 A | 5/2006 |
| KR | 1020060067579 A | 6/2006 |
| KR | 1020060068969 A | 6/2006 |
| KR | 1020060070734 A | 6/2006 |

* cited by examiner

*Primary Examiner*—Huan Hoang
(74) *Attorney, Agent, or Firm*—Townsend and Townsed and Crew LLP (57) ABSTRACT

A non-volatile memory device of the present invention includes a page buffer having a bit line selecting circuit, a first register, a second register, a data comparing circuit, a first bit line voltage controller, and a second bit line voltage controller. The bit line selecting circuit couples selectively a certain bit line to a sensing node. The first register and the second register store given data. The data comparing circuit compares the data stored in the first register with the data stored in the second register, and transmits the comparison result to the sensing node. The first bit line voltage controller applies a voltage of low level to the bit line in accordance with a voltage level of the data stored in the first register. The second bit line voltage controller applies a selected first voltage of high level to the bit line in accordance with the data stored in the second register.

24 Claims, 7 Drawing Sheets

NON-VOLATILE MEMORY DEVICE AND METHOD OF PROGRAMMING A MULTI LEVEL CELL IN THE SAME

CROSS-REFERENCE TO RELATED APPLICATIONS

This application claims priority from Korean Patent Application No. 2006-136356, filed on Dec. 28, 2006, the contents of which are incorporated herein by reference in its entirety.

BACKGROUND OF THE INVENTION

The present invention relates to a non-volatile memory device and a method of programming a multi-level cell. More particularly, the present invention relates to a page buffer for efficiently programming a most significant bit in a multi-level cell.

Recently, the demand for a non-volatile memory device which programs/erases data electrically and does not need to have the data periodically refreshed has been increased. In addition, to enhance the degree of integration of the non-volatile memory device, studies concerning a cell for storing data above one bit have been actively pursued.

Hereinafter, a non-volatile memory device having a cell for storing data with a plurality of bits is referred to as a multi level cell (MLC) non-volatile memory device.

For example, in the non-volatile memory device having the multi-level cell for storing data of 2 bits, one cell can store one of the four possible data combinations, i.e. 11, 10, 01 and 00. As a result, the degree of integration of the non-volatile memory device may be increased in view of the increased logic.

A program operation about cells in the MLC non-volatile memory device includes an operation for programming a cell in steps unlike a single level cell (SLC) non-volatile memory device having a single level cell for storing one bit. Additionally, the MLC non-volatile memory device may store data having a plurality of conditions through the above operation.

In this case, a part of cells in the MLC non-volatile memory device are first programmed when a program operation about specific cells included in one page is performed.

Other cells are once programmed in a previous step. Here, when a program operation about the cells programmed once is again performed, a phenomenon that threshold voltages of the cells are not increased may occur if a program voltage of above a given value is not applied to the cells. As a result, a time required for programming cells already programmed once is increased compared with that required for the first programming, and so a program disturbance phenomenon may occur.

SUMMARY OF THE INVENTION

It is a feature of the present invention to provide a non-volatile memory device having a page buffer which applies a higher voltage during the most significant bit operation than in a previous least significant bit program operation, and applies a higher voltage than a low level to a bit line corresponding to a cell group where a most significant bit is programmed but not the low significant bit.

It is a feature of the present invention to provide a method of programming a multi level cell in a non-volatile memory device which applies a voltage higher than a voltage in a least significant bit program operation when a program operation about a most significant bit is performed, and applies a voltage higher than a low level to a bit line corresponding to a cell group where a most significant bit is programmed without programming a low significant bit.

A non-volatile memory device according to one example embodiment of the present invention includes a page buffer having a bit line selecting circuit, a first register, a second register, a data comparing circuit, a first bit line voltage controller, and a second bit line voltage controller. The bit line selecting circuit couples selectively a certain bit line to a sensing node. The first register and the second register store given data. The data comparing circuit compares the data stored in the first register with the data stored in the second register, and transmits the comparison result to the sensing node. The first bit line voltage controller applies a voltage of low level to the bit line in accordance with a voltage level of the data stored in the first register. The second bit line voltage controller applies a selected first voltage of high level to the bit line in accordance with the data stored in the second register.

A method of programming a multi level cell in a non-volatile memory device according to one example embodiment of the present invention includes programming and verifying a LSB data about a certain cell; transmitting data to be programmed as a MSB about the cell to a first register of a page buffer; reading data stored in the cell in accordance with a LSB program, and storing the read data in a second register of the page buffer; resetting the data stored in the second register in accordance with data stored in the first register, thereby specifying a cell where a LSB and a MSB is to be programmed; comparing the reset data with the data stored in the first register, thereby specifying a cell where only MSB is to be programmed; precharging a bit line related to the cell where the MSB and the LSB is to be programmed to a voltage of low level; precharging a bit line related to the cell where only MSB is to be programmed to a voltage of selected high level; and performing a ISPP program operation where an initial voltage is higher by a certain level than in a LSB program operation.

A method of programming a multi level cell in a non-volatile memory device according to another example embodiment of the present invention includes specifying a first cell group having a cell where a LSB and a MSB are programmed and a second cell group having a cell where a LSB is not programmed and a MSB is programmed; precharging a bit line coupled to the first cell group to a voltage of low level; precharging a bit line coupled to the second cell group to a voltage of selected high level; and performing a ISPP program operation where an initial voltage is higher by about 3V to 4V than in a LSB program operation.

A non-volatile memory device of the present invention may reduce a program time when a most significant bit is programmed. That is, in case that the non-volatile memory device has a first cell where a most significant bit is programmed without programming a least significant bit and a second cell where a most significant bit and a least significant bit are programmed, the least significant bit is programmed in advance before programming the most significant bit in the second cell. Accordingly, the non-volatile memory device has a problem that a threshold voltage corresponding to the second cell is slowly increased during the second cell is programmed.

To solve the above problem, an initial program voltage applied to a cell when an ISPP program voltage is applied has a value higher than that in a common occasion. Further, since an over program about a cell which programs a most significant bit without programming a least significant bit may be occurred, the non-volatile memory device increases the level of a bit line voltage through a second voltage controller so as to solve the above over program. As a result, a program operation may be performed stably and rapidly.

In an experiment, the program time in the ISPP program operation is reduced by about eight pulses compared with that in the common occasion.

DESCRIPTION OF SPECIFIC EMBODIMENTS

Hereinafter, the embodiments of the present invention will be explained in more detail with reference to the accompanying drawings.

Figure 1A:
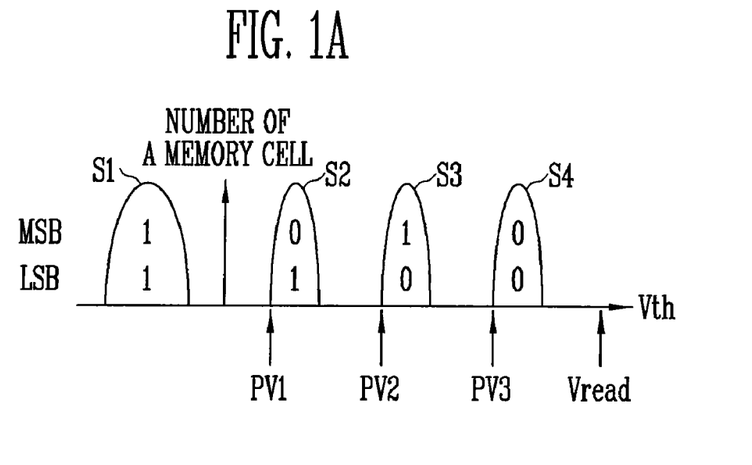
FIG. 1A to FIG. 1C are views illustrating in steps a process of programming a cell in a non-volatile memory device according to one embodiment of the present invention.

Referring to FIG. 1A, threshold voltage distributions of each of the cells according to one embodiment of the invention are shown. In addition, data to be stored in a cell corresponding to each of the threshold voltage distributions are specified.

The cell is initialized by an erase operation, and this condition corresponds to a first cell group S1 having a lowest threshold voltage distribution. In the first cell group S1, a least significant bit (LSB) and a most significant bit (MSB) are 1 and 1, respectively. In a second cell group S2 having a second lowest threshold voltage distribution, a LSB and MSB are 1 and 0, respectively. In a third cell group S3 having a second highest threshold voltage distribution, a LSB and MSB are 0 and 1, respectively. In a fourth cell group S4 having a highest threshold voltage distribution, a LSB and MSB are 0 and 0, respectively.

Figure 1B:
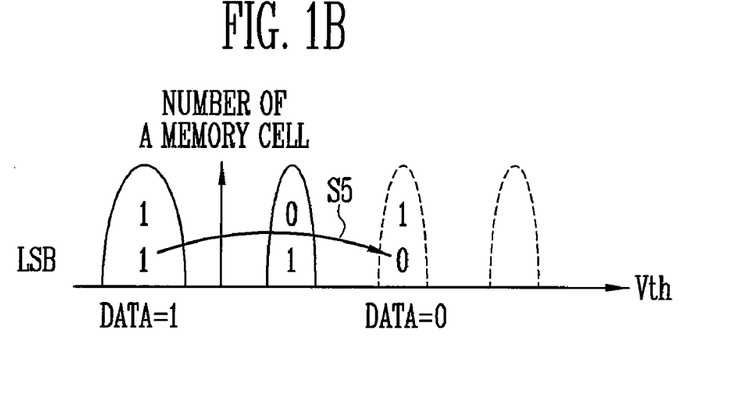

In FIG. 1B, a step S5 for programming the third cell group S3 through a LSB program is shown. Here, the LSB program programs a LSB of cells in the first cell group S1 to 0. In this case, cells not programmed in the first cell group S1 maintain their distributions.

Figure 1C:
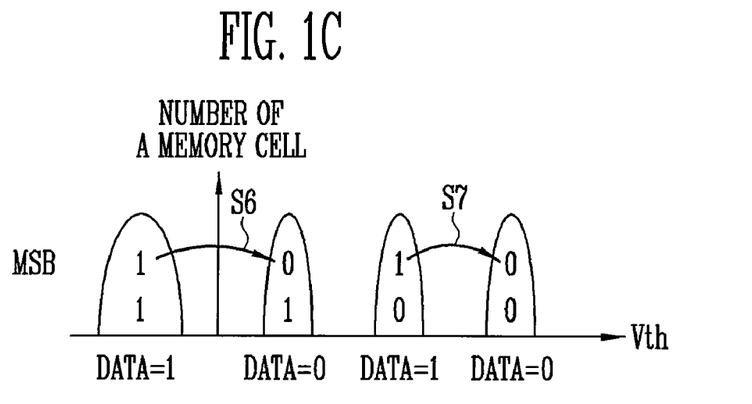

In FIG. 1C, a step S6 for programming the second cell group S2 and a step S7 for programming the fourth cell group S4 are shown. Here, the step S6 programs a MSB of cells in the first cell group S1 to 0. In this case, cells not programmed into the second cell group S2 maintain their distributions. In addition, the step S7 programs a MSB of cells in the third cell group S3 (the cell was placed in S3 by having the threshold voltage increased by the above LSB program) to 0. Here, cells not programmed in the third cell group S3 maintain their distributions.

In this case, the threshold voltages of the first and third cell groups S1 and S3 related to the MSB program have different magnitudes. Accordingly, when programming the cell groups S1 and S3 by applying the same program voltage, a phenomenon where the threshold voltage of a corresponding cell is not increased occurs if a program voltage of above a given value is not applied to the cells programmed once. As a result, a time required for programming the cell already programmed once is increased compared with that required for first programming the cell, and so a program disturbance phenomenon may occur.

Figure 2:
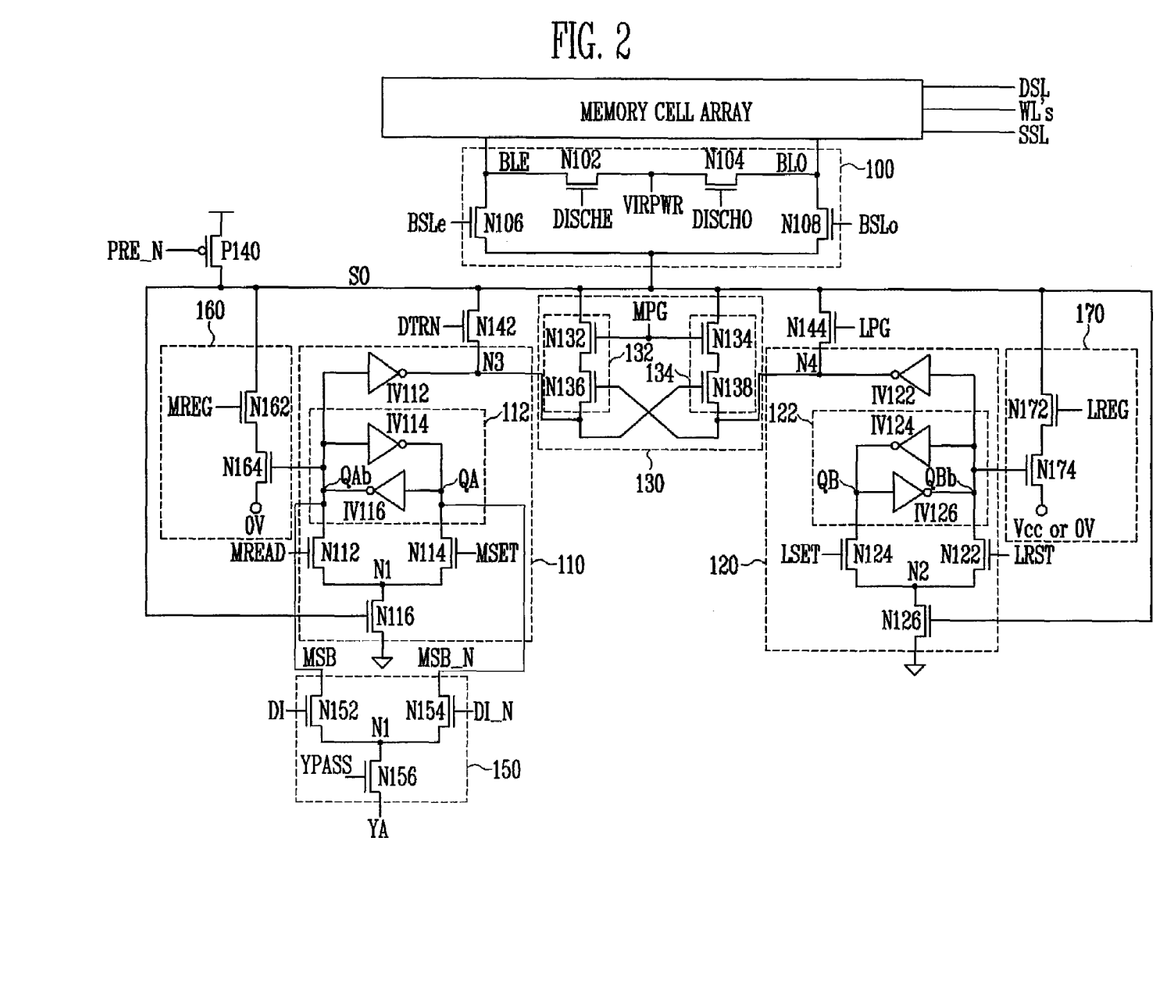
FIG. 2 is a view illustrating the circuitry of a non-volatile memory device according to one example embodiment of the present invention.

Referring to FIG. 2, the non-volatile memory device of the present embodiment includes a memory cell array where data are stored and a page buffer.

The page buffer includes a bit line selecting circuit 100, a first register 110, a second register 120, a data comparing circuit 130, a data input circuit 150, a first bit line voltage controller 160, and a second bit line voltage controller 170. The selecting circuit 100 is for coupling selectively a bit line BLe or BLo to a sensing node SO. The first register 110 and a second register 120 are for storing certain data. The data comparing circuit 130 is for comparing data stored in the first register 110 with data stored in the second register 120 and then transmitting the comparison result to the sensing node SO. The first bit line voltage controller 160 is for applying a voltage having a low level to the bit line in accordance with the voltage level of the data stored in the first register 110. The second bit line voltage controller 170 is for applying a voltage having a high level to the bit line in accordance with the voltage level of the data stored in the second register 120.

The bit line selecting circuit 100 has a plurality of N-MOS transistors N102 to N108.

The N-MOS transistor N102 is coupled between an even bit line BLe and a bias voltage VIRPWR, and is turned on in response to an even discharge signal DISCHE. When the N-MOS transistor N102 is turned on, the bias voltage VIRPWR is applied to the even bit line BLe.

The N-MOS transistor N104 is coupled between an odd bit line BLo and the bias voltage VIRPWR, and is turned on in response to an odd discharge signal DISCHO. When the N-MOS transistor N104 is turned on, the bias voltage VIRPWVR is applied to the odd bit line BLo.

The N-MOS transistor N106 is coupled between the even bit line BLe and the sensing node SO, and is turned on in response to an even bit line selecting signal BSLe. When the N-MOS transistor N106 is turned on, the even bit line BLe is coupled to the sensing node SO.

The N-MOS transistor N108 is coupled between the odd bit line BLo and the sensing node SO, and is turned on in response to an odd bit line selecting signal BSLo. When the N-MOS transistor N108 is turned on, the odd bit line BLo is coupled to the sensing node SO.

The first register 110 includes a latch 112 having two inverters IV114 and IV116, a N-MOS transistor N114 coupled to a first node QA of the latch 112, a N-MOS transistor N112 coupled to a second node QAb of the latch 112, and an inverter IV112. Additionally, the first register 110 has a N-MOS transistor N116 coupled between a coupling node N1 of the N-MOS transistors N112 and N114 and a ground.

The N-MOS transistor N112 is coupled between the second node QAb and the coupling node N1, and is turned on in response to a MSB reading signal MREAD.

The N-MOS transistor N114 is coupled between the first node QA and the coupling node N1, and is turned on in response to a MSB setting signal MSET.

The N-MOS transistor N116 is coupled between the coupling node N1 and the ground, and is turned on in accordance with the voltage level of the sensing node SO, thereby supplying a ground voltage to the coupling node N1.

The second register 120 includes a latch 122 having two inverters IV124 and IV126, a N-MOS transistor N124 coupled to a first node QB of the latch112, a N-MOS transistor N122 coupled to a second node QBb of the latch 122, and an inverter IV122. Further, the second register 120 has a N-MOS transistor N126 coupled between a coupling node N2 of the N-MOS transistors N122 and N124 and the ground.

The N-MOS transistor N122 is coupled between the second node QBb and the coupling node N2, and is turned on in response to a LSB reset signal LRST.

The N-MOS transistor 124 is coupled between the first node QB and the coupling node N2, and is turned on in response to a LSB setting signal LSET.

The N-MOS transistor N126 is coupled between the coupling node N2 and the ground, and is turned on in accordance with the voltage level of the sensing node SO, thereby supplying the ground voltage to the coupling node N2.

The data comparing circuit 130 provides a logical product of the data stored in the first register 110 and the data stored in the second register 120 to the sensing node SO in response to a MSB program signal MPG.

The data comparing circuit 130 includes a first comparing circuit 132 and a second comparing circuit 134.

The first comparing circuit 132 has N-MOS transistors N132 and 136. The N-MOS transistors N132 and N136 are coupled in series between the sensing node SO and a node N3. The N-MOS transistor N132 is turned on in response to the MSB program signal MPG, and the N-MOS transistor N136 is turned on in response to a voltage of a node N4. As a result, the sensing node SO is coupled to the node N3 or is separated from the node N3 by the N-MOS transistors N132 and N136.

The second comparing circuit 134 has N-MOS transistors N134 and N138.

The N-MOS transistor N134 and N138 are coupled in series between the sensing node SO and the node N4.

The N-MOS transistor N134 is turned on in response to the MSB program signal MPG, and the N-MOS transistor N138 is turned on in response to a voltage of the node N3. As a result, the sensing node SO is coupled to the node N4 or is separated from the node N4 by the N-MOS transistors N134 and N138.

A precharge transistor P140 is turned on for a certain time when the data comparing circuit 130 is operated, and so the sensing node SO is precharged to a high level. In this condition, the MSB program signal MPG is provided. In this case, the voltage level of the sensing node SO is varied depending on the voltage level of the nodes N3 and N4 as shown below table.

| Operation of the comparing circuit | A voltage of the node N3 | A voltage of the node N4 | A voltage of the sensing node SO |
|---|---|---|---|
| N136 and N138 are turned on | High | high | high |
| N138 is turned on | High | low | low |
| N136 is turned on | Low | high | low |
| N136 and N138 are turned off | Low | low | Maintaining a precharge level |

As shown in the above table, the on/off state of the N-MOS transistors N136 and N138 are determined in accordance with the voltage levels of the nodes N3 and N4. Hence, it is determined whether or not the voltage of each of the nodes N3 and N4 affects the sensing node SO.

However, when the voltages of the nodes N3 and N4 have a low level, the N-MOS transistors N136 and N138 are turned off, and so the transmission of the logical product data is stopped. In this case, the voltage of the sensing node SO depends on a precharge level.

The data inputting circuit 150 includes N-MOS transistors N152 and N154.

The N-MOS transistor N152 is coupled between the second node QAb and an input/output terminal YA, and is turned on in response to a data input signal DI. Here, when the N-MOS transistor N152 is turned on, data of the input/output terminal YA are provided to the second node QAb of the first register 110.

The N-MOS transistor N154 is coupled between the first node QA and the input/output terminal YA, and is turned on in response to an inverse data input signal nDI. Here, when the N-MOS transistor N154 is turned on, the data of the input/output terminal YA are transmitted to the first node QA. Accordingly, in the case that the data input signal DI having a high level are inputted during the input/output terminal YA is coupled to the ground voltage, the N-MOS transistor N152 is turned on, and so the second node QAb has a low level. However, in the case that the inverse data input signal nDI having a high level, the N-MOS transistor N154 is turned on, and so the first node QA has a low level. As a result, data are inputted through the input/output terminal YA.

On the other hand, the first bit line voltage controller 160 is coupled to the second node QAb of the first register 110 and the sensing node SO. In addition, the first bit line voltage controller 160 includes a N-MOS transistor N164 for providing the ground voltage to the sensing node SO in response to the data stored in the first register 110, and a N-MOS transistor N164 which is coupled between the N-MOS transistor N164 and the sensing node SO and provides the ground voltage to the sensing node SO in response to a first bit line voltage controlling signal MREG.

The second bit line voltage controller 170 is coupled to the second node QBb of the second register 120 and the sensing node SO.

Additionally, the second bit line voltage controller 170 includes a N-MOS transistor N174 for providing a power supply voltage Vcc to the sensing node SO in response to the data stored in the second register 120, and a N-MOS transistor N172 which is coupled between the N-MOS transistor N174 and the sensing node SO and provides the power supply voltage Vcc to the sensing node SO in response to a second bit line voltage controlling signal LREG.

Here, the level of a voltage applied to the sensing node SO in the LSB program operation is different from that of a voltage applied to the sensing node SO in the MSB program operation. In particular, the ground voltage is applied to the sensing node SO in the LSB program operation, and a voltage having a high level is applied to the sensing node SO. This is will be described in detail with reference to the accompanying drawings.

The voltage level of the first bit line voltage controlling signal MREG is lower than that of the second bit line voltage controlling signal LREG. It is desirable that the second bit line voltage controlling signal LREG is higher than the first bit line voltage controlling signal MREG by about 1.5V to 2.0V.

In addition, it is desirable that the first bit line voltage controlling signal MREG has a voltage level that is a threshold voltage higher then when the N-MOS transistor N162 is turned on. The second bit line voltage controlling signal LREG has a voltage level higher than a threshold voltage of the N-MOS transistor N172 when the LSB is programmed, and has a voltage level higher than the sum of the threshold voltage of the N-MOS transistor N172 and the selected high level voltage when the MSB is programmed. Here, the selected high level voltage has about 1.5V to 2.0V.

On the other hand, N-MOS transistors N142 and N144 for data transmission are coupled between the nodes N3 and N4 and the sensing node SO.

The N-MOS transistor N142 is coupled between the sensing node SO and the node N3, and is turned on in response to a data transmitting signal DTRN. Accordingly, when the N-MOS transistor N142 is turned on, data of the node N3 is transmitted to the sensing node SO.

The N-MOS transistor N144 is coupled between the sensing node SO and the node N4, and is turned on in response to a LSM program signal LPG. Accordingly, data of the node N4 are transmitted to the sensing node SO when the N-MOS transistor N144 is turned on.

Additionally, the P-MOS transistor P140 coupled between a power supply voltage VDD and the sensing node SO is turned on in response to the precharge signal PRE_N having a low level. In this case, the power supply voltage VDD is applied to the sensing node SO when the P-MOS transistor P140 is turned on, and so the sensing node SO is precharged up to a level of the power supply voltage VDD.

Figure 3:
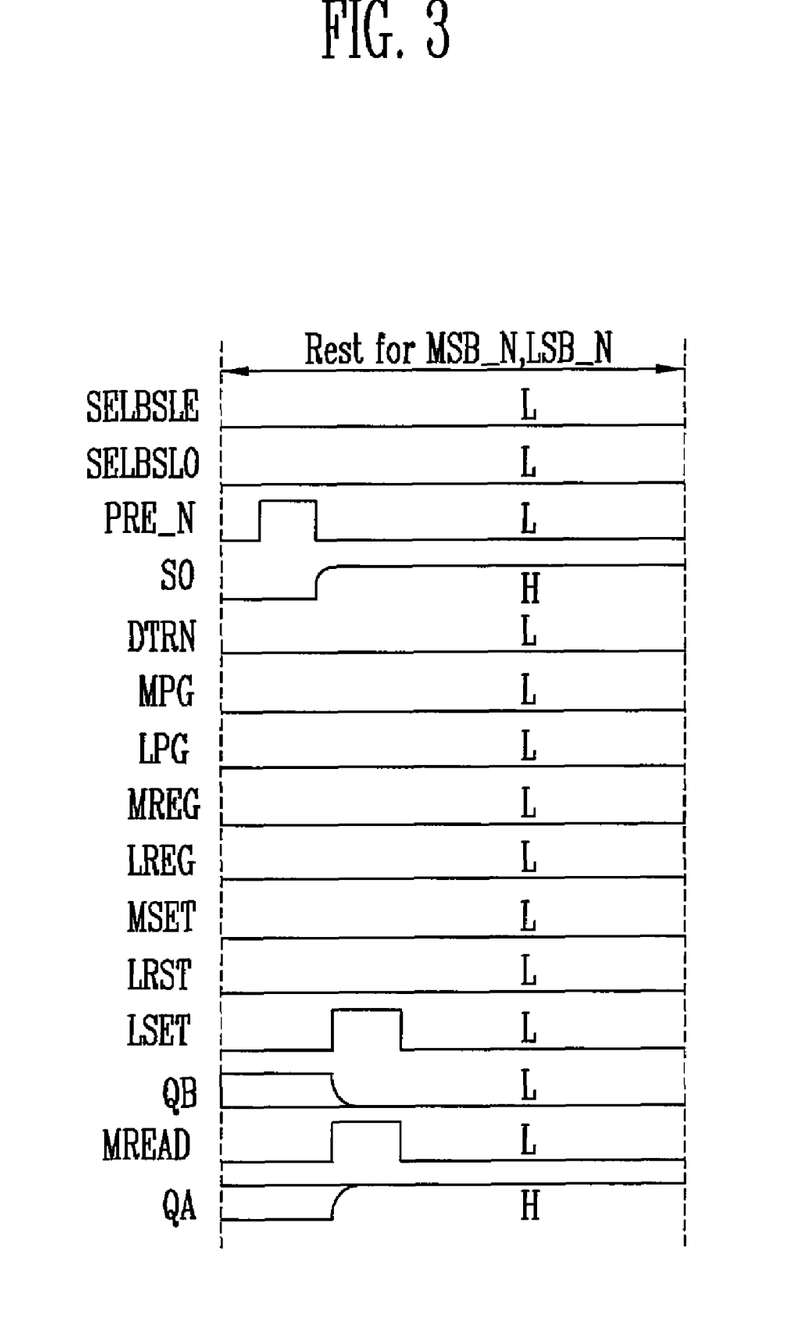
FIG. 3 is a timing diagram illustrating an operation of initializing each of the registers included in the page buffer according to one example embodiment of the present invention.

FIG. 3 is a timing diagram illustrating an operation of initializing each of the registers included in the page buffer according to one embodiment of the present invention.

In the precharge signal PRE_N having a low level is provided to the P-MOS transistor P140 for a given time, the P-MOS transistor P140 is turned on, and so the power supply voltage VDD is applied to the sensing node SO. Accordingly, since the sensing node SO is precharged up to the level of the power supply voltage, a voltage of the sensing node SO has a high level. The N-MOS transistor N116 included in the first register 110 is turned on in response to the voltage of the sensing node SO. In this case, the MSB reading signal MREAD having high level is provided to the N-MOS transistor N112, and so the N-MOS transistor N112 is turned on. As a result, the ground voltage Vss is coupled to the second node QAb, and thus the ground voltage Vss is applied to the second node QAb. Accordingly, the voltage of the second node QAb is initialized to a low level, and the voltage of the first node QA is initialized to a high level.

Further, the N-MOS transistor N126 included in the second register 120 is turned on in response to the voltage of the sensing node SO. In this case, the LSB setting signal LSET having high level is provided to the N-MOS transistor N124, and so the N-MOS transistor N124 is turned on. As a result, the ground voltage Vss is coupled to the first node QB, and so the ground voltage Vss is applied to the node QB. Accordingly, the voltage of the first node QB is initialized to a low level.

The above initializing operation is commonly used before the following LSB program operation and MSB program operation are performed in order to initializing each of the page buffers. In short, the first node QA of the first register 110 is initialized to a high level, and the first node QB of the second register 120 is initialized to a low level.

Figure 4:
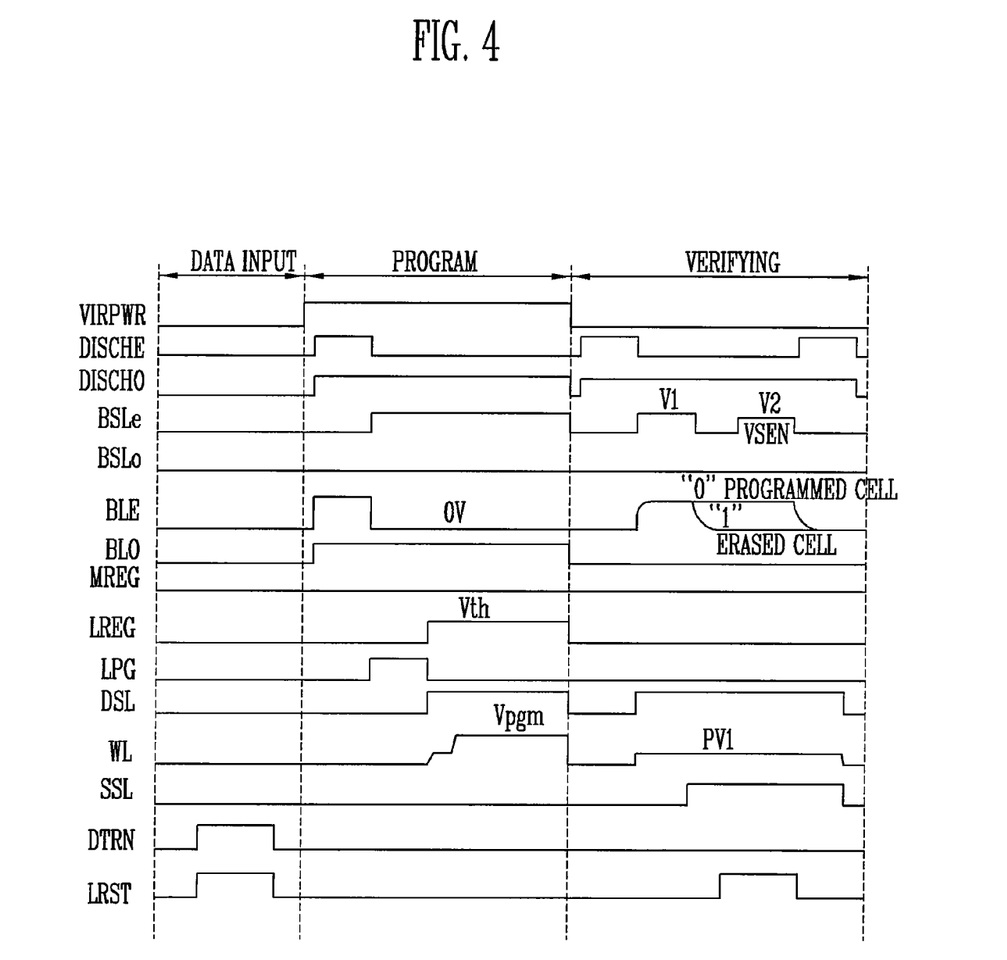
FIG. 4 is a timing diagram illustrating the operation of the LSB program according to one example embodiment of the present invention.

Referring to the timing diagram of the LSB program in FIG. 4, during a data input time, data to be inputted to a certain cell are provided from the data inputting circuit 150 prior to a program operation, and then the provided data are transmitted to the second register 120 through the first register 110.

In particular, in the case that the inputted data is "1 (erased cell)", data having a high level are transmitted to the first node QA of the first register 110 through the data inputting circuit 150. Subsequently, when the data transmitting signal DTRN having a high level is transmitted to the transistor N142 for data transmission, the data transmitted to the first node QA are provided to the sensing node SO through the latch and the inverter IV112, and the N-MOS transistor N126 of the second register 120 is turned on by data having a high level. In this case, the LSB reset signal LRST having a high level is transmitted to the N-MOS transistor N122 of the second register 120, and so the N-MOS transistor N122 is turned on. Therefore, the ground voltage is applied to the second node QBb, and the data having a high level is provided to the first node QB.

On the other hand, in the case that the inputted data is "0 (programmed cell)", data having a low level are transmitted to the first node QA of the first register 110 through the data inputting circuit 150. Then, when the data transmitting signal DTRN having a high level is transmitted to the transistor N142 for data transmission, the data transmitted to the first node QA are provided to the sensing node SO through the latch and the inverter IV112, and the N-MOS transistor N126 of the second register 120 is turned off by the data having a low level. In this case, the LSB reset signal LRST having high level is transmitted to the N-MOS transistor N122 of the second register 120, and so the N-MOS transistor N122 is turned on. However, since the N-MOS transistor N126 is turned off, the data initially stored in the second register 120 are maintained in its entirety. Accordingly, the first node QB maintains the data having a low level transmitted initially in its entirety.

Hereinafter, a program operation will be described in detail.

The even discharge signal DISCHE is enabled, and so the N-MOS transistor N102 is turned on. Hence, the bias voltage VIRPWR is applied to the even bit line BLe, and so the even bit line BLe is precharged to a voltage of a high level.

In addition, the odd discharge signal DISCHO is enabled, and the N-MOS transistor N104 is turned on. Therefore, the bias voltage VIRPWR is applied to the odd bit line BLo, and so the odd bit line BLo is precharged to a voltage of a high level.

The even discharge signal DISCHE is disabled after a certain time from being enabled, and so the N-MOS transistor N102 is turned off. Hence, the supply of the bias voltage VIRPWR applied to the even bit line BLe is cut off. On the other hand, since the odd discharge signal DISCHO maintains an enable state for the program time, the odd bit line BLo maintains the voltage of a high level.

Next, the LSB program signal LPG is provided to the transistor N144 for data transmission, and so the sensing node SO is coupled to the node N4.

In the case that the LSB data is '1', the data of a high level is transmitted to the first node QB of the second register 120 as mentioned above. Hence, the data of a high level is provided to the node N4 and the sensing node SO through the latch 120 and the inverter IV122.

In the case that the LSB data is '0', the data of a low level is transmitted to the first node QB of the second register 120 as mentioned above. Therefore, the data of a low level is provided to the node N4 and the sensing node SO through the latch 120 and the inverter IV122.

Further, the even bit line selecting signal BSLe is transmitted to the bit line selecting circuit 100, and thus the N-MOS transistor N106 is turned on. As a result, the even bit line BLe is coupled to the sensing node SO. In this case, the voltage of the even bit line BLe is varied depending on the voltage level of the sensing node SO. Since the data of a high level is provided to the sensing node SO when the LSB data is '1', the voltage of the even bit line BLe has a high level. However, in a case contrary to the above, the data of the sensing node SO has a low level. (FIG. 4 shows the LSB program operation when the LSB data is '0'.)

The second bit line voltage controlling signal LREG is transmitted to the second bit line voltage controller 170, and so a voltage corresponding to the threshold voltage of the N-MOS transistor N172 is applied. Additionally, in the case that the LSB data is '0', the voltage of the first node QB is inverted by the inverter IV126, and so the N-MOS transistor N174 is turned on.

When the LSB program is performed as described above, the ground voltage is provided to one terminal of the N-MOS transistor N174. Accordingly, the N-MOS transistors N172 and N174 are turned on, and so the ground voltage is applied to the sensing node SO. As a result, the bit line has a voltage of a low level.

In addition, a voltage of a high level is applied to a drain selecting transistor DSL, and so a cell string having a specific cell of the memory cell array is coupled to a given bit line.

Moreover, a program voltage is applied to a selected word line by using an incremental step pulse program (hereinafter, referred to as "ISPP") method.

In this embodiment the program voltage is applied to the selected word line, with the program voltage being increased in increments of about 0.2V from about 13.0V.

Hereinafter, a verifying operation will be described in detail.

The even discharge signal DISCHE is enabled for a given time, and so the N-MOS transistor N102 is turned on. Here, the bias voltage VIRPWR is converted into a low level, and thus the even bit line BLe is discharged to a voltage of a low level.

In addition, the odd discharge signal DISCHO is enabled, and so the N-MOS transistor N104 is turned on. Hence, the odd bit line BLo is discharged to a voltage of a low level.

Subsequently, a voltage V1 of a high level is applied to the even bit line selecting transistor N106 for a given time, and so the even bit line BLe is coupled to the sensing node SO. In this case, the precharge transistor P140 is turned on for a certain time, and so the sensing node SO is precharged to a high level, wherein this process is not shown in FIG. 4.

Additionally, the voltage of a high level is applied to the drain selecting transistor DSL, and so the cell string having a specific cell of the memory cell array is coupled to a corresponding bit line.

Moreover, a verifying reference voltage PV2 is applied to a selected word line.

Then, a voltage V2 of a high level is applied to the even bit line selecting transistor N106 for a certain time, and the even bit line BLe is coupled to the sensing node SO.

Further, a voltage of a high level is applied to a source selecting transistor SSL, and so the cell string having the specific cell of the memory cell array is coupled to a common source line. As a result, a current path is formed between the bit line and the common source line.

Accordingly, in the case that a certain cell is programmed, the threshold voltage is increased. Hence, no current is passed through the current path, and so the voltage level of the bit line is maintained in its entirety. However, in the case that a certain cell is not programmed (i.e., erased cell) a current is passed through the current path. As a result, the voltage level of the bit line is discharged to a low level.

The voltage level of the sensing node SO is determined in accordance with the voltage level of the bit line. Here, since the voltage level of the bit line is maintained with a high level when the cell is programmed, the N-MOS transistor N126 of the second register 120 is turned on. In this case, since the signal having high level is transmitted to the N-MOS transistor N122 of the second register 120, the second node QB has the data of a high level when the cell is programmed. However, the second node QB maintains the data of a low level transmitted initially when the cell is not programmed.

It is verified through the above process whether or not a corresponding cell is programmed. Here, the programmed cell corresponds to the cell for storing data '10' in FIG. 1.

Hereinafter, a MSB program operation will be described in detail.

The initializing operation of each of the registers 110 and 120 described in FIG. 3 is performed before the MSB program operation is performed.

The first node QA of the first register 110 and the first node QB of the second register 120 are initialized to a high level and a low level by the initializing operation, respectively.

Subsequently, data to be programmed to the MSB is inputted to the first register 110 of the page buffer. This inputting process is performed through the same process as in the data inputting time in FIG. 4, and '1' or '0' is inputted through the data input circuit 150.

Next, data stored in a certain cell is read by the LSB program, and then the read data is stored in the second register 120 of the page buffer. This operation is similar to the program verifying operation in FIG. 4. However, a verifying reference voltage PV2 is not applied to a selected word line, a voltage of 0V is applied to the selected word line. Then, it is discriminated whether or not the program operation is performed.

In the case that it is discriminated that a LSB of a certain cell is programmed, the voltage level of the sensing node SO maintains high level. Whereas, in the case that it is discriminated that the LSB of the cell is erased, the voltage level of the sensing node SO maintains a low level. Here, the N-MOS transistor N126 of the second register 120 is turned on when the sensing node SO maintains a high level. In this case, since the N-MOS transistor N122 is turned on by the signal LRST having a high level, the second node QBb and the first node QB have the data of a low level and the data of the a high level, respectively.

On the other hand, since the N-MOS transistor N126 is turned off when the sensing node SO has a low level, the first node QB maintains the data of a low level corresponding to the initializing operation.

Accordingly, in the case that a LSB in a cell is programmed, the data of a high level is stored in the first node QB of the second register 120. However, in the case that the LSB in the cell is erased, the data of a low level is stored in the first node QB.

In brief, data '1' or data '0' to be programmed through the data inputting circuit 150 is stored in the first register 110, and data '1' or data '0' is stored in the second register 120 in accordance with the discrimination as to whether or not a specific cell is programmed.

Next, the data stored in the second register 120 is reset in accordance with the data stored in the first register 110 so that a cell wherein a MSB and a LSB will be programmed is specified.

This operation is performed to store the data '0' in the second register 120 only when a MSB in a cell where a LSB is not programmed is to be programmed, e.g. in case of data '01' in FIG. 1.

In addition, this operation is performed to store data '1' in the registers 110 and 120 when no program operation is needed, e.g. data '11', '10' in FIG. 1. Further, this operation is performed for the purpose of storing data '0' in the first register 110 only when a MSB in a cell where a LSB is programmed will be programmed, i.e. in case of data '00' in FIG. 1.

The data transmission operation is performed through the same data transmission operation as in FIG. 4. That is, when the inputted data is '1 (erased cell)', the data of high level is stored in the first node QA of the first register 110 through the data inputting circuit 150. Here, when the signal DTRN having a high level is transmitted to the transistor N142 for data transmission, the data stored in the first node QA is provided to the sensing node SO through the latch and the inverter IV112, and the N-MOS transistor N126 is turned on by the data of a high level. In this case, the LSB reset signal LRST having a high level is transmitted to the N-MOS transistor N122 of the second register 120, and so the N-MOS transistor N122 is turned on. Hence, the ground voltage is applied to the second node QBb, and the data of a high level is stored in the first node QB.

In the case that the inputted data is '0 (programmed cell)', data of a low level is stored in the first node QA of the first register 110 through the data inputting circuit 150. Here, when the signal DTRN having a high level is transmitted to the transistor N142 of a data transmission, the data stored in the first node QA is provided to the sensing node SO through the latch and the inverter IV112, and the data of a low level is transmitted to the N-MOS transistor N126 of the second register 120. As a result, the N-MOS transistor N126 is turned off. In this case, the LSB reset signal LRST having a high level is transmitted to the N-MOS transistor N122 of the second register 120, and so the N-MOS transistor N122 is turned on. However, since the N-MOS transistor N126 is turned off, the data stored initially in the second register 120 is maintained in its entirety. Accordingly, the data of a low level stored initially in the first node QA is maintained.

In short, irrespective of the kind of data stored previously in the second register 120, data '1' is stored in the second register 120 when the data inputted to the first register 110 is '1', and the data stored previously in the second register 120 is maintained when the data inputted to the first register 110 is '0'. This can be understood by referring to the table below.

| Data stored in the second register 120 | Data inputted to the first register 110 | Change of the data in the second register 120 |
| --- | --- | --- |
| 0 (erased cell) | 0 (program data) | 0 –> 0 |
| | 1 (erase data) | 0 –> 1 |
| 1 (programmed cell) | 0 (program data) | 1 –> 1 |
| | 1 (erase data) | 1 –> 1 |

In brief, when a MSB in a cell where a LSB is not programmed is to be programmed, data '0' is stored in the second register 120 only when the data '01' stored in a corresponding cell, and data '1' is stored in the second register 120 in the other case. However, data '0' is stored in the first register 110 when data '0' is stored in the second register 120, and thus the above case is not distinguished from a case that a MSB in a cell where a LSB is programmed is to be programmed. Hence, to distinguish the cases, data '0' stored in the first register 110 is converted into '1' through an operation of comparing the data.

Subsequently, the data stored in the second register 120 and the data stored in the first register 110 are compared so that a cell where only MSB is to be programmed is specified.

The data stored in the first register 110 and the data stored in the second register 120 are compared through the data comparing circuit 130 for the above comparing operation, and then the data stored in the first register 110 is reset in accordance with the comparison result. This is for the purpose of storing data '0' in the first register 110 only when a MSB in a cell where a LSB is programmed is to be programmed.

Referring to the above table related to the operation of resetting the data, only when the MSB in the cell where the LSB is programmed is to be programmed, data '0' is stored in advance in the first register 110 and data '1' is stored in the second register 120. Accordingly, an extra comparing operation is not needed. However, when the MSB in the cell where the LSB is not programmed is to be programmed, data '0' is stored in the first register 110, and so a process of converting the data '0' into data '1' is needed.

The data comparing operation through the data comparing circuit 130 is processed as described above.

Firstly, the P-MOS transistor P140 for precharge is turned on, and so the sensing node SO is precharged to a high level.

Then, the N-MOS transistors N132 and N134 of the data comparing circuit 130 are turned on in accordance with the MSB program signal MPG having a high level. In this case, the voltage level of the sensing node SO is varied depending on the voltage level of the node N3 in the first comparing circuit 132 and the node N4 in the second comparing circuit 134, and this is shown in a table below.

| Operation of the data comparing circuit 130 | Voltage of the node N3 | Voltage of the node N4 | Voltage of the sensing node SO |
| --- | --- | --- | --- |
| N136 and N138 are turned on | High | high | high |
| N138 is turned on | High | low | low |
| N136 is turned on | Low | high | low |
| N136 and N138 are turned off | Low | low | A precharging level is maintained |

The voltage of the node N3 is substantially identical to the level of the data stored in the first register 110, and the voltage of the node N4 is substantially identical to the level of the data stored in the second register 120.

As shown in the above table, the N-MOS transistors N136 and N138 are turned on or off in accordance with the voltage levels of the node N3 in the first comparing circuit 132 and the node N4 in the second comparing circuit 134. As a result, it is determined whether or not the voltage levels of the nodes N3 and N4 affect the sensing node SO.

Next, the signal MREAD having a high level is transmitted to the N-MOS transistor N112, and the ground voltage is applied to the second node QAb in accordance with the voltage of the sensing node SO.

In the case that the voltage of the sensing node SO has a high level in accordance with the data level of the registers 110 and 120, a signal having a high level is transmitted to the N-MOS transistor N116. Therefore, the ground voltage is applied to the second node QAb, and so the data of a high level (i.e., data '1') is stored in the first node QA. Accordingly, the data stored in the first register 110 is not changed in the above table.

In the case that the voltage of the sensing node SO has a low level in accordance with the voltage level of the registers 110 and 120, the signal having a low level is transmitted to the N-MOS transistor N116. Hence, the data stored in the first register 110 is maintained.

In the case that the voltages of the nodes N3 and N4 have a low level (i.e., the data stored in each of the registers 110 and 112 is '0'), the transistors N136 and N138 are turned off. Hence, the voltage of the sensing node SO depends on its precharge level. Here, since the sensing node SO is precharged to a high level, the N-MOS transistor N116 is turned on. Accordingly, the ground voltage is applied to the second node QAb, and so the data of a high level (i.e., data '1') is stored in the first node QA.

In short, when the MSB in the cell where the LSB is not programmed is to be programmed, data '0' is stored in advance in the registers 110 and 120. However, the data '0' stored in the first register 110 is converted into data '1' by the above comparing operation. Accordingly, data '0' is stored in only the second register 120.

The state of the data stored in each of the registers 110 and 120 after the data resetting operation and the data comparing operation are finished are shown in a table below.

|  | First register 110 | Second register 120 |
| --- | --- | --- |
| In case that data '11' is inputted | 1 | 1 |
| In case that data '10' is inputted | 1 | 1 |
| In case that data '01' is inputted | 1 | 0 |
| In case that data '00' is inputted | 0 | 1 |

In the case that the data is stored in each of the registers 110 and 120, the step of preparing the program operation is finished.

Hereinafter, an operation of programming MSB will be described in detail.

Figure 5:
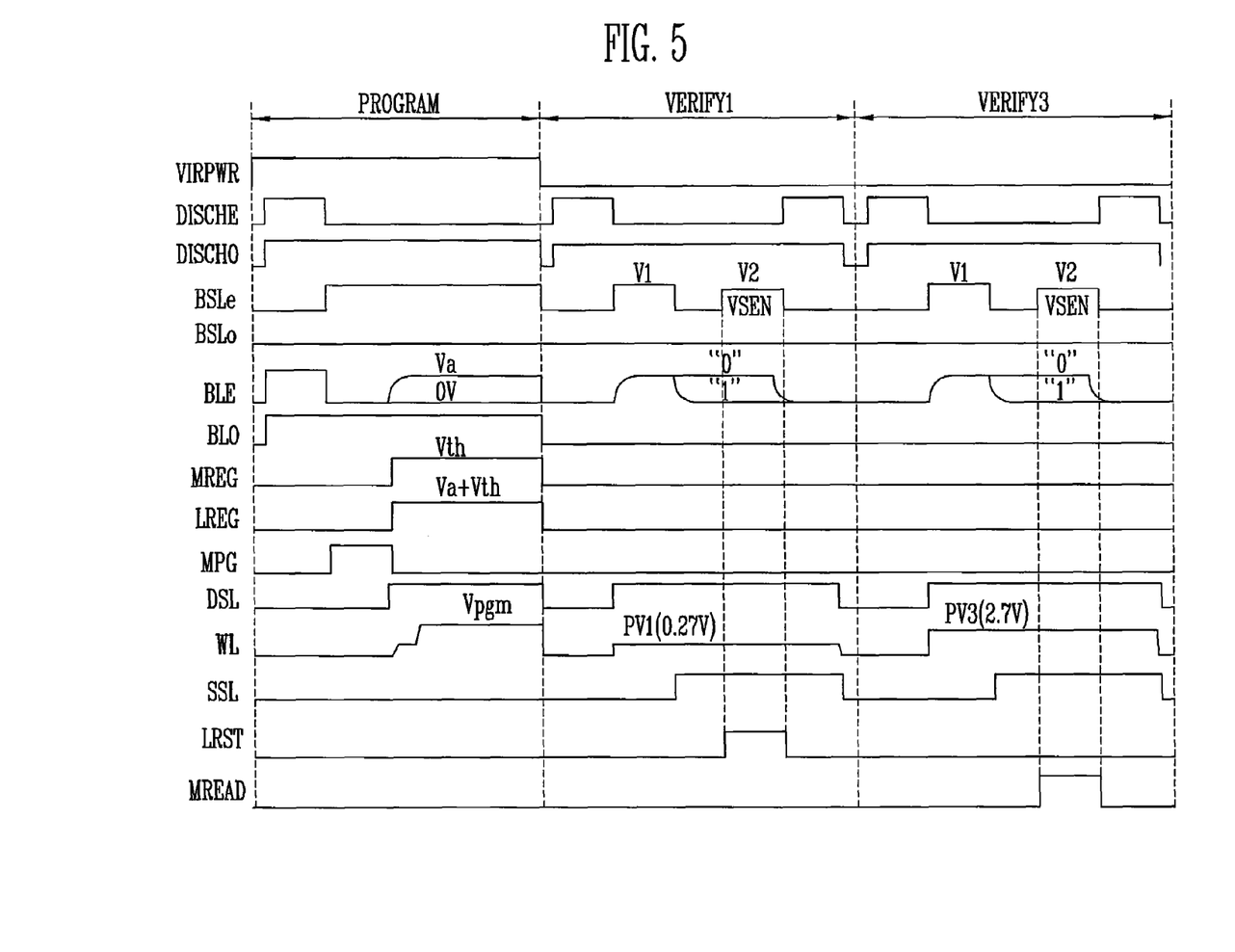
FIG. 5 is a view illustrating a waveform related to the MSB program operation according to one example embodiment of the present invention.

Referring to FIG. 5, the even discharge signal DISCHE is enabled, and so the N-MOS transistor N102 is turned on. Hence, the bias voltage VIRPWR is applied to the even bit line BLe, and so the even bit line BLe is precharged to a voltage of a high level.

In addition, the odd discharge signal DISCHO is enabled, and so the N-MOS transistor N104 is turned on. Accordingly, the bias voltage VIRPWR is applied to the odd bit line BLo, and so the odd bit line BLo is precharged to a voltage of a high level.

The even discharge signal DISCHE is disabled after a certain time from being enabled, and so the N-MOS transistor N102 is turned off. Accordingly, the bias voltage VIRPWR applied to the even bit line BLe is cut off.

On the other hand, since the odd discharge signal DISCHO maintains an enable state during the program time, the odd bit line BLo maintains the voltage of a high level.

Subsequently, the MSB program signal MPG having a high level is transmitted to the N-MOS transistors N132 and N134 of the data comparing circuit 130, and so the data in the registers 110 and 120 are provided to the sensing node SO.

The data comparing circuit 130 operates as described above. The voltage of a high level is applied to the sensing node SO only when data '1' is stored in each of the registers 110 and 120, but the voltage of a low level is applied to the sensing node SO in the other case. Here, since the voltage of a high level is applied to the sensing node SO when data '1' is stored in each of the registers 110 and 120, i.e. the inputted data is '11', '10', the data is not programmed. However, because the voltage of a low level is applied to the sensing node SO when data '0' is stored in one or more of the registers 110 and 120, i.e. the inputted data is '01', '00', the data is programmed.

Additionally, the even bit line selecting signal BSLe is transmitted to the bit line selecting circuit 100, and so the N-MOS transistor N106 is turned on. As a result, the even bit line BLe is coupled to the sensing node SO. Here, the voltage of the even bit line BLe is varied depending on the voltage level of the sensing node SO. In this case, because the data of a high level is transmitted to the sensing node SO when the LSB data is '1', the even bit line BLe has the voltage of a high level. However, in case of the data of a low level is transmitted to the sensing node SO, the even bit line BLe has the voltage of a low level.

On the other hand, the first bit line voltage controlling signal MREG is transmitted to the first bit line voltage controller 160, wherein the first bit line voltage controlling signal MREG has the voltage level corresponding to the threshold voltage of the N-MOS transistor N162. Here, when the data stored in the first node QA of the first register 110 is '0', the voltage level of the first node QA is inverted by the inverter IV116, and so the N-MOS transistor N164 is turned on. Accordingly, the N-MOS transistors N162 and N164 are turned on, and so the ground voltage is applied to the sensing node SO. As a result, the bit line has a voltage of a low level.

Further, the second bit line voltage controlling signal LREG is transmitted to the second bit line voltage controller 170, and has a voltage Va higher by a certain level than the threshold voltage of the N-MOS transistor N172. Here, when the data stored in the first node QB of the second register 120 is '0', the voltage level of the first node QB is inverted by the inverter IV126. As a result, the N-MOS transistor N174 is turned on.

On the other hand, the power supply voltage Vcc coupled to the N-MOS transistor N174 is set to have a voltage higher than the voltage Va.

In the MSB program operation unlike the LSB program operation, the voltage level of the bit line may be increased by a certain value. Hence, a voltage of a high level is applied in the MSB program operation. In particular, the power supply voltage Vcc by an internal power source has a value between about 1.5V and about 2.3V, and the power supply voltage Vcc by an outside power source has a value between about 2.7V and about 3.6V.

In the case that the N-MOS transistor N174 is turned on, a coupling point between the N-MOS transistor N172 and the N-MOS transistor N174 has a voltage of (Vcc−Vth).

On the other hand, since the second bit line voltage controlling signal LREG has a voltage of (Va+Vth), some voltage Va of the voltage of (Vcc−Vth) is applied to the sensing node SO in accordance with the bit line voltage controlling signal LREG As a result, the bit line has a voltage higher by a certain level Va than the low level. In this embodiment the voltage of the certain level Va is about 1.5V to 2.0V.

In brief, the voltage level of the bit line may be adjusted in accordance with the data to be programmed under control of the first bit line voltage controller 160 and the second bit line voltage controller 170.

In other words, when the data to be programmed is '00', data '0' is stored in only the first register 110. In this case, the voltage level of the bit line is not changed. However, when the data to be programmed is '01', data '0' is stored in only the second register 120. In this case, the voltage level of the bit line is increased by a value of above the certain level Va. This will be described in detail with reference to accompanying drawings.

Figure 6A:
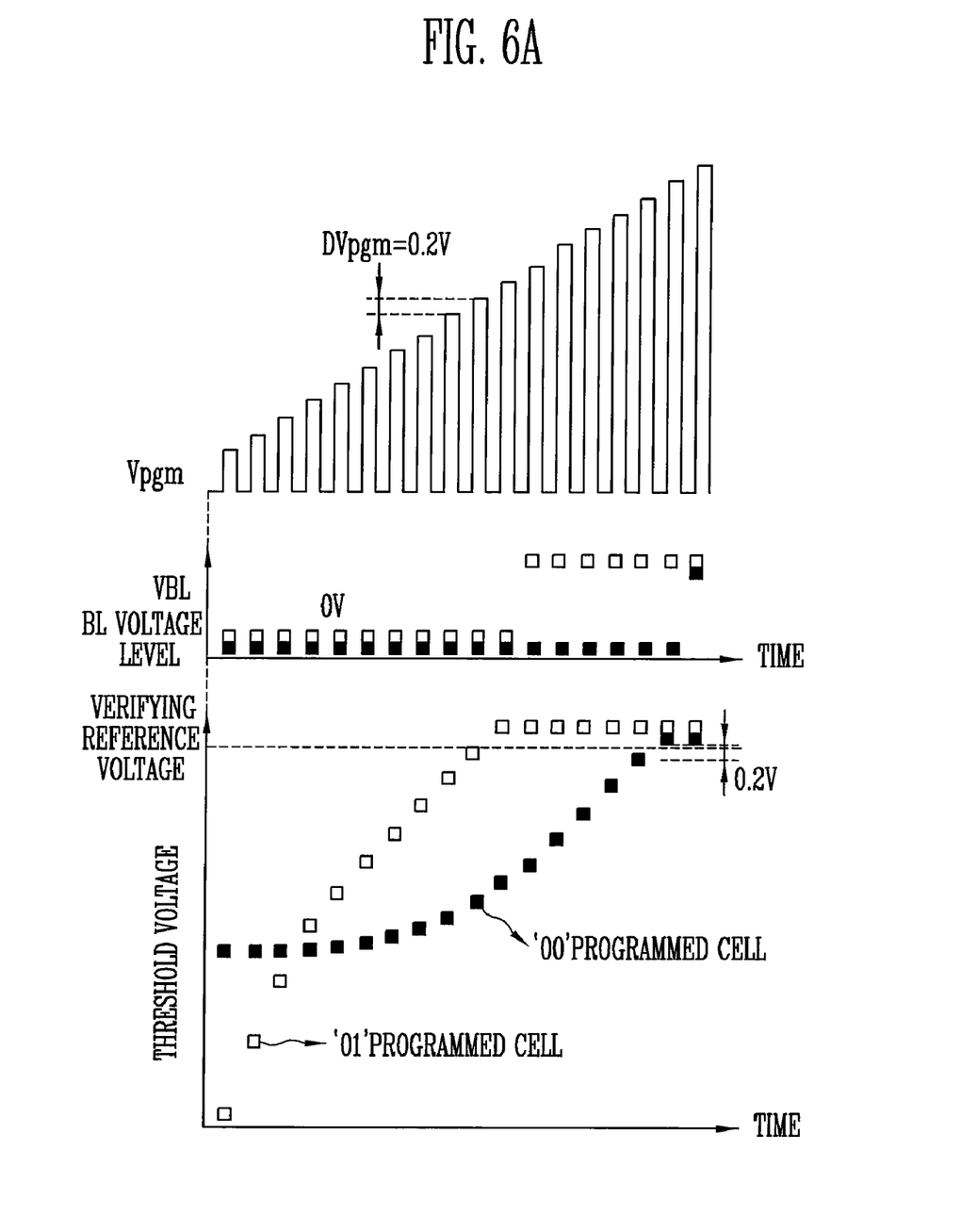
FIG. 6A is a view illustrating voltage condition of given cells by the MSB program of a common MLC program operation.
Figure 6B:
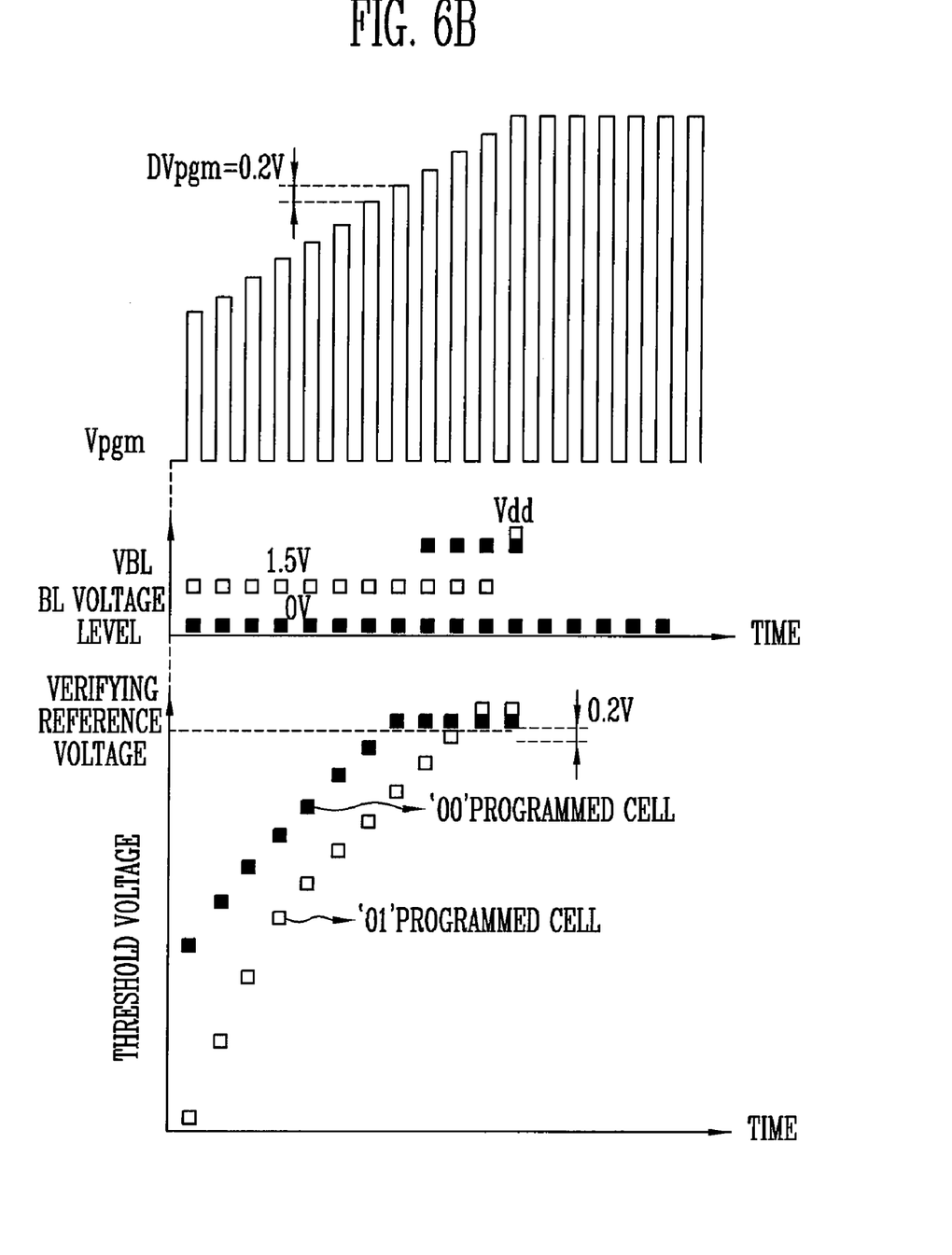
FIG. 6B is a view illustrating voltage condition of certain cells by the MSB program of the MLC program operation according to one example embodiment of the present invention.

FIG. 6A is a view illustrating voltage condition of given cells by the MSB program of a common MLC program operation. FIG. 6B is a view illustrating voltage conditions of certain cells by the MSB program of the MLC program operation according to one embodiment of the present invention.

In FIG. 6A, in the case that a MSB in a cell where a LSB is not programmed is to be programmed (i.e., '01' program cell), the threshold voltage corresponding to the cell is apt to increase continuously as the ISPP program voltage is increased. However, in the case that a LSB and MSB are to be programmed (i.e., '00' program cell), the threshold voltage of the cell is increased after a given time even though the ISPP program voltage is increased. As a result, a total program time may be increased. This is because the threshold voltage has a state increased by a voltage of above a certain level when the LSB is programmed in advance, and so the cell is not programmed in a voltage less than a specific voltage.

To solve the problem, in the MSB program operation of the present invention, an initial voltage is increased by a voltage of above a certain level when the ISPP voltage is applied. This is for the purpose of increasing rapidly the threshold voltage when the LSB and MSB are to be programmed, i.e. '00' program cell.

FIG. 6B shows how the initial voltage is increased by a voltage of above a certain level when the ISPP voltage is applied. Accordingly, the threshold voltage is increased rapidly compared to that in FIG. 6A when the LSB and MSB are to be programmed, i.e. '00' program cell.

In the case that the above program voltage is applied when the MSB in the cell where the LSB is not programmed is to be programmed (i.e., '01') program cell, an over program may occur due to a sudden increase of the program voltage. Accordingly, the voltage level of the bit line is increased by the certain level Va so as to prevent the over program.

In the case that the voltage level of the bit line is increased by the level Va, a voltage smaller by the level Va than the program voltage applied to the word line, i.e. Vpgm-Va is applied to a floating gate so that the over program may be prevented.

In brief, when data '01' is to be programmed, the voltage level of the bit line is increased by the level Va in accordance with the operation of the bit line voltage controllers 160 and 170. In addition, when data '00' is to be programmed, the bit line has 0V in accordance with the operation of the bit line voltage controllers 160 and 170.

Hereinafter, the program operation will be described continuously with reference to FIG. 5.

The voltage of a high level is applied to the drain selecting transistor DSL, and so the cell string having a specific cell of the memory cell array is coupled to a corresponding bit line.

In addition, the program voltage by the ISPP method is applied to the selected word line. In this case, the initial voltage of the program voltage is applied with a different method from a common method as described above.

Generally, the LSB program voltage and the MSB program voltage are applied with a different magnitude from each other. That is, the MSB program voltage is applied from an initial voltage higher by about 2.0V than an initial voltage when the LSB program voltage is applied.

However, in one embodiment of the present invention, the MSB program voltage is applied from an initial voltage higher by about 3.5V than an initial voltage when the LSB program voltage is applied. In other words, the program voltage is applied with increasing in steps by about 0.2V from about 16.5V.

Next, the verifying operation will be described in detail.

A cell having two threshold voltages is formed by one program operation in accordance with the storage state of the data, wherein the threshold voltages have different magnitude each other. Hence, two verifying steps are performed on the basis of two verifying reference voltages PV1 and PV3 having different magnitudes from each other.

Firstly, it is verified on the basis of a first verifying reference voltage PV1 whether or not the program about data '01' is successfully performed. Here, the verifying operation is similar to that in FIG. 4.

The even discharge signal DISCHE is enabled for a certain time, and so the N-MOS transistor N102 is turned on. In this case, since the bias voltage VIRPWR is converted into a low level, the even bit line BLe is discharged to a voltage of a low level.

Additionally, the odd discharge signal DISCHO is enabled, and so the N-MOS transistor N104 is turned on. Hence, the odd bit line BLo is discharged to a voltage of a low level.

Subsequently, a voltage V1 of high level is applied to the even bit line selecting transistor N106 for a certain time, and so the even bit line BLe is coupled to the sensing node SO. In this case, the transistor P140 is turned on, and so the sensing node SO is precharged to a voltage of a high level. This is not shown in FIG. 5.

Further, a voltage of a high level is applied to the drain selecting transistor DSL, and so the cell string having a certain cell of the memory cell array is coupled to a corresponding bit line.

Moreover, the first verifying reference voltage PV1 is applied to the selected word line.

Then, a voltage V2 of a high level is applied to the even bit line selecting transistor N106 for a certain time, and so the even bit line BLe is coupled to the sensing node SO.

In addition, a voltage of a high level is applied to the source selecting transistor SSL, and so the cell string having a certain cell of the memory cell array is coupled to the common source line. As a result, a current path is formed between the bit line and the common source line. Accordingly, when a specific cell is programmed, the threshold voltage is increased. Hence, a current is not passed through the current path, and so the voltage level of the bit line is maintained in its entirety. However, when a certain cell is not programmed, i.e. erased cell, a current passes through the current path. As a result, the voltage level of the bit line is discharged to a low level.

The voltage level of the sensing node SO is determined in accordance with the voltage level of the bit line. Here, since the voltage level of the bit line is maintained with a high level when the cell is programmed, the N-MOS transistor N126 of the second register 120 is turned on. In this case, since the signal LRST having a high level is transmitted to the N-MOS transistor N122 of the second register 120, the first node QB has the data of a high level when the cell is programmed. However, the first node QB maintains the data of a low level stored initially when the cell is not programmed.

It is verified through the above process whether or not a corresponding cell is programmed. Here, the programmed cell corresponds to the cell for storing data '10' in FIG. 1.

Next, it is verified on the basis of a second verifying reference voltage PV3 whether or not the program about data '00' is successfully performed.

The verifying operation is similar to that mentioned above, but an interval of sensing data is different.

The voltage level of the sensing node SO is determined in accordance with the voltage level of the bit line. Here, since the voltage level of the bit line is maintained with high level when the cell is programmed, the N-MOS transistor N116 as well as the N-MOS transistor N126 of the second register 120 is turned on.

Unlike the verifying operation about data '01', the signal MREAD having a high level is transmitted to the N-MOS transistor N112 of the first register 110. Hence, the data of a high level is stored in the first node QA when a corresponding cell is programmed. However, the data of a low level stored initially is maintained when a corresponding cell is not programmed.

It is verified through the above process whether or not a corresponding cell is programmed. Here, the programmed cell corresponds to the cell for storing data '00' in FIG. 1.

The method of programming the multi level cell for storing 2 bits is described above. However, the method may be applied to a method of programming a multi level cell for 3 bits or 4 bits. That is, the method should include a process of setting the program voltages depending on each of the bits.

In addition, the method may include a process of specifying a group having cells programmed in a previous step and a group having cells to be programmed initially. Here, the voltage level of the bit line corresponding to the cells programmed initially is higher than that of the bit line corresponding to the cells programmed in the previous step.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A non-volatile memory device comprising:
a memory cell array to store data;
a page buffer coupled to the memory cell array via at least first and second bit lines,
wherein the page buffer includes:
a bit line selecting circuit configured to couple selectively the first or second bit line to a sensing node;
a first register and a second register configured to store given data;
a data comparing circuit configured to compare the data stored in the first register with the data stored in the second register, and transmit a result of the comparison to the sensing node;
a first bit line voltage controller configured to apply a first voltage to the selected bit line in accordance with a voltage level of the data stored in the first register; and
a second bit line voltage controller configured to apply a second voltage higher than the first voltage to the selected bit line in accordance with the data stored in the second register.

2. The non-volatile memory device of claim 1, wherein the first bit line voltage controller includes:
a first transistor configured to provide a ground voltage to the sensing node in response to the data stored in the first register; and
a second transistor provided between the first transistor and the sensing node, and configured to provide the ground voltage to the sensing node in response to a first bit line voltage control signal.

3. The non-volatile memory device of claim 1, wherein the second bit line voltage controller includes:
a first transistor configured to provide a power supply voltage to the sensing node in response to the data stored in the second register; and
a second transistor provided between the first transistor and the sensing node, and configured to provide the power supply voltage to the sensing node in response to a second bit line voltage control signal.

4. The non-volatile memory device of claim 2, wherein a voltage level of the first bit line voltage control signal is higher than a threshold voltage of the second transistor.

5. The non-volatile memory device of claim 3, wherein a ground voltage is provided as the power supply voltage when a LSB (least significant bit) program operation is performed, and a high voltage is provided as the power supply voltage when a MSB program operation is performed.

6. The non-volatile memory device of claim 5, wherein a voltage level of the second bit line voltage control signal is higher than a threshold voltage of the second transistor when a LSB is programmed, and is higher than sum of the threshold voltage of the second transistor and the second voltage when a MSB (most significant bit) is programmed.

7. The non-volatile memory device of claim 6, wherein the magnitude of the second voltage is about 1.5V to 2.0V.

8. The non-volatile memory device of claim 1, wherein the data comparing circuit transmits a logical product data of the data stored in the first register and the data stored in the second register to the sensing node in response to a MSB program signal.

9. The non-volatile memory device of claim 8, wherein the data comparing circuit stops the transmission of the logical product data if the data stored in the first register and the data stored in the second register are '0' and '0', respectively.

10. A method of programming a multi level cell in a non-volatile memory device, the method comprising:
programming a LSB (least significant bit) data of a cell in the memory device;
transmitting data to be programmed as a MSB (most significant bit) of the cell to a first register of a page buffer;
reading data stored in the cell in accordance with a LSB program, and storing the read data in a second register of the page buffer;
resetting the data stored in the second register in accordance with the data stored in the first register, thereby specifying a first selected cell where a LSB and a MSB is to be programmed;
comparing the reset data with the data stored in the first register, thereby specifying a second selected cell where only MSB is to be programmed;

precharging a bit line related to the first selected cell to a first voltage;

precharging a bit line related to the second selected cell to a second voltage higher than the first voltage; and performing a ISPP program operation where an initial voltage is higher by a certain level than in a LSB program operation.

11. The method of claim 10, wherein the step of specifying the first selected cell includes:

storing data '0' in the first register; and storing data '1' in the second register, wherein the first voltage is a low voltage and the second voltage is a high voltage.

12. The method of claim 10, wherein the step of specifying the second selected cell where the MSB is to be programmed includes:

storing data '1' in the first register; and storing data '0' in the second register, wherein the first voltage is a low voltage and the second voltage is a high voltage.

13. The method of claim 10, wherein the step of precharging the bit line to the first voltage includes:

applying a ground voltage to the bit line in accordance with a voltage level of the data stored in the first register.

14. The method of claim 10, wherein the step of precharging the bit line to the second voltage includes:

applying a high voltage to the bit line in accordance with a voltage level of the data stored in the second register.

15. The method of claim 14, wherein the second voltage is no more than 2.0V.

16. The method of claim 10, wherein the initial voltage is about 13V when the LSB is programmed by the ISPP, and a step voltage associated with the ISPP is about 0.2V.

17. The method of claim 10, wherein the initial voltage is about 16.5V when the MSB is programmed by the ISPP, and a step voltage associated with the ISPP is about 0.2V.

18. A method of programming a multi level cell in a non-volatile memory device comprising:

specifying a first cell group having a first cell where a LSB and a MSB are programmed and a second cell group having a second cell where a LSB is not programmed and a MSB is programmed;

precharging a bit line coupled to the first cell group to a first voltage;

precharging a bit line coupled to the second cell group to a second voltage higher than the first voltage; and performing an ISPP program operation where an initial voltage is higher than in a LSB program operation.

19. The method of claim 18, wherein data '0' is stored in a first register of a page buffer related to the first cell group, and data '1' is stored in a second register of the page buffer, wherein the initial voltage of the ISPP program operation is higher than that of the LSB program operation by at least 3V.

20. The method of claim 18, wherein data '1' is stored in a first register of a page buffer related to the second cell group, and data '0' is stored in a second register of the page buffer, wherein the initial voltage of the ISPP program operation is higher than that of the LSB program operation by 3V to 4V.

21. The method of claim 18, wherein the step of precharging the bit line to the first voltage includes:

applying a ground voltage to the bit line in accordance with the data stored in the first register of the page buffer.

22. The method of claim 18, wherein the step of precharging the bit line to the second voltage includes:

applying the high voltage to the bit line in accordance with a voltage level of the data stored in the second register of the page buffer.

23. The method of claim 18, wherein the first voltage is a voltage which sustains a voltage of the bitline as low level to provide a program pulse to the bitline.

24. The method of claim 18, wherein the second voltage is a voltage which rises a voltage of the bitline over a certain voltage to prevent a overprogram.

* * * * *